United States Patent
St. Amand et al.

(10) Patent No.: US 8,084,868 B1
(45) Date of Patent: *Dec. 27, 2011

(54) SEMICONDUCTOR PACKAGE WITH FAST POWER-UP CYCLE AND METHOD OF MAKING SAME

(75) Inventors: Roger D. St. Amand, Tempe, AZ (US); Vladimir Perelman, Fremont, CA (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/818,446

(22) Filed: Jun. 18, 2010

Related U.S. Application Data

(63) Continuation of application No. 12/105,196, filed on Apr. 17, 2008, now Pat. No. 7,768,135.

(51) Int. Cl.
*H01L 23/48* (2006.01)
*H01L 23/52* (2006.01)
(52) U.S. Cl. .. 257/777; 257/724; 257/783; 257/E23.169
(58) Field of Classification Search .................. 257/777, 257/724, 783, 787, E23.169
See application file for complete search history.

(56) References Cited

U.S. PATENT DOCUMENTS

| | | | |
|---|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — Tu-Tu Ho
(74) *Attorney, Agent, or Firm* — Stetina Brunda Garred & Brucker

(57) ABSTRACT

In accordance with the present invention, there is provided multiple embodiments of a semiconductor package including at least two electronic components which are provided in a stacked arrangement, and are each electrically connected to an underlying substrate through the use of conductive wires. In accordance with one embodiment of the present invention, the electronic components are separated from each other by an intervening spacer which is typically fabricated from aluminum, or from silicon coated with aluminum. In this particular embodiment, the uppermost electronic component of the stack is electrically connected to at least one of the conductive wires through the use of a conductive paste layer which is also used to secure the uppermost electronic component to the underlying spacer. In this regard, one end of one of the conductive wires may be embedded in the conductive paste layer adjacent one side of the uppermost electronic component, or between the bottom surface of such electronic component and the spacer.

12 Claims, 2 Drawing Sheets

U.S. PATENT DOCUMENTS

| | | | |
|---|---|---|---|
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorpe, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,970,780 A * | 11/1990 | Suda et al. | 29/840 |
| 4,987,475 A | 1/1991 | Sclesinger et al. | |
| 5,018,003 A | 5/1991 | Yasunaga et al. | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson et al. | |
| 5,118,298 A | 6/1992 | Murphy | |
| 5,122,860 A | 6/1992 | Kichuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, 3rd et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,285,352 A | 2/1994 | Pastore et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,467,032 A | 11/1995 | Lee | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A | 5/1996 | Aono et al. | |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,637,922 A | 6/1997 | Fillion et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasaranthi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,683,943 A | 11/1997 | Yamada | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davies et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,854,512 A | 12/1998 | Manteghi | |
| 5,856,911 A | 1/1999 | Riley | |
| 5,859,471 A | 1/1999 | Kuraishi et al. | |
| 5,866,939 A | 2/1999 | Shin et al. | |
| 5,866,942 A | 2/1999 | Suzuki et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,973,935 A | 10/1999 | Schoenfeld et al. | |
| 5,977,630 A | 11/1999 | Woodworth et al. | |
| RE36,773 E | 7/2000 | Nomi et al. | |
| 6,107,679 A | 8/2000 | Noguchi | |
| 6,143,981 A | 11/2000 | Glenn | |
| 6,166,430 A | 12/2000 | Yamaguchi | |
| 6,169,329 B1 | 1/2001 | Farnworth et al. | |
| 6,177,718 B1 | 1/2001 | Kozono | |
| 6,181,002 B1 | 1/2001 | Juso et al. | |
| 6,184,465 B1 | 2/2001 | Corisis | |
| 6,184,573 B1 | 2/2001 | Pu | |

| | | |
|---|---|---|
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,429,508 B1 | 8/2002 | Gang |
| 6,437,429 B1 | 8/2002 | Su et al. |
| 6,437,449 B1 * | 8/2002 | Foster ................. 257/777 |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,465,883 B2 | 10/2002 | Olofsson |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,534,849 B1 | 3/2003 | Gang |
| 6,545,332 B2 | 4/2003 | Huang |
| 6,545,345 B1 | 4/2003 | Glenn et al. |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,603,196 B2 | 8/2003 | Lee et al. |
| 6,624,005 B1 | 9/2003 | DiCaprio et al. |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Matthews et al. |
| 6,696,752 B2 | 2/2004 | Su et al. |
| 6,700,189 B2 | 3/2004 | Shibata |
| 6,713,375 B2 | 3/2004 | Shenoy |
| 6,737,750 B1 * | 5/2004 | Hoffman et al. ............. 257/777 |
| 6,757,178 B2 | 6/2004 | Okabe et al. |
| 6,794,740 B1 | 9/2004 | Edwards et al. |
| 6,800,936 B2 | 10/2004 | Kosemura et al. |
| 6,812,552 B2 | 11/2004 | Islam et al. |
| 6,858,919 B2 | 2/2005 | Seo et al. |
| 6,867,492 B2 | 3/2005 | Auburger et al. |
| 6,878,571 B2 | 4/2005 | Isaak et al. |
| 6,897,552 B2 | 5/2005 | Nakao |
| 6,927,478 B2 | 8/2005 | Paek |
| 7,002,805 B2 | 2/2006 | Lee et al. |
| 7,005,327 B2 | 2/2006 | Kung et al. |
| 7,015,571 B2 | 3/2006 | Chang et al. |
| 7,053,469 B2 | 5/2006 | Koh et al. |
| 7,102,209 B1 | 9/2006 | Bayan et al. |
| 7,185,426 B1 | 3/2007 | Hiner |
| 7,211,471 B1 | 5/2007 | Foster |
| 7,245,007 B1 | 7/2007 | Foster |
| 7,253,503 B1 | 8/2007 | Fusaro et al. |
| 2001/0008305 A1 | 7/2001 | McClellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0164387 A1 | 8/2004 | Ikenaga et al. |
| 2004/0253803 A1 | 12/2004 | Tomono et al. |
| 2006/0087020 A1 | 4/2006 | Hirano et al. |

| | | | | | | |
|---|---|---|---|---|---|---|
| 2006/0157843 | A1 | 7/2006 | Hwang | JP | 6140563 | 5/1994 |
| 2006/0231939 | A1 | 10/2006 | Kawabata et al. | JP | 6252333 | 9/1994 |
| 2007/0045824 | A1* | 3/2007 | Zhao et al. .......... 257/706 | JP | 6260532 | 9/1994 |

FOREIGN PATENT DOCUMENTS

| | | | | | |
|---|---|---|---|---|---|
| EP | 0393997 | 10/1990 | JP | 7297344 | 11/1995 |
| EP | 0459493 | 12/1991 | JP | 7312405 | 11/1995 |
| EP | 0720225 | 3/1996 | JP | 8064364 | 3/1996 |
| EP | 0720234 | 3/1996 | JP | 8083877 | 3/1996 |
| EP | 0794572 A2 | 10/1997 | JP | 8125066 | 5/1996 |
| EP | 0844665 | 5/1998 | JP | 964284 | 6/1996 |
| EP | 0936671 | 8/1999 | JP | 8222682 | 8/1996 |
| EP | 0989608 | 3/2000 | JP | 8306853 | 11/1996 |
| EP | 1032037 | 8/2000 | JP | 98205 | 1/1997 |
| JP | 55163868 | 12/1980 | JP | 98206 | 1/1997 |
| JP | 5745959 | 3/1982 | JP | 98207 | 1/1997 |
| JP | 58160096 | 8/1983 | JP | 992775 | 4/1997 |
| JP | 59208756 | 11/1984 | JP | 9260568 | 10/1997 |
| JP | 59227143 | 12/1984 | JP | 9293822 | 11/1997 |
| JP | 60010756 | 1/1985 | JP | 10022447 | 1/1998 |
| JP | 60116239 | 8/1985 | JP | 10199934 | 7/1998 |
| JP | 60195957 | 10/1985 | JP | 10256240 | 9/1998 |
| JP | 60231349 | 11/1985 | JP | 11307675 | 11/1999 |
| JP | 6139555 | 2/1986 | JP | 2000150765 | 5/2000 |
| JP | 61248541 | 11/1986 | JP | 20010600648 | 3/2001 |
| JP | 629639 | 1/1987 | JP | 200519848 | 7/2002 |
| JP | 6333854 | 2/1988 | JP | 200203497 | 8/2002 |
| JP | 63067762 | 3/1988 | KR | 941979 | 1/1994 |
| JP | 63188964 | 8/1988 | KR | 19940010938 | 5/1994 |
| JP | 63205935 | 8/1988 | KR | 19950018924 | 6/1995 |
| JP | 63233555 | 9/1988 | KR | 19950041844 | 11/1995 |
| JP | 63249345 | 10/1988 | KR | 19950044554 | 11/1995 |
| JP | 63289951 | 11/1988 | KR | 19950052621 | 12/1995 |
| JP | 63316470 | 12/1988 | KR | 1996074111 | 12/1996 |
| JP | 64054749 | 3/1989 | KR | 9772358 | 11/1997 |
| JP | 1106456 | 4/1989 | KR | 100220154 | 6/1999 |
| JP | 1175250 | 7/1989 | KR | 20000072714 | 12/2000 |
| JP | 1205544 | 8/1989 | KR | 20000086238 | 12/2000 |
| JP | 1251747 | 10/1989 | KR | 20020049944 | 6/2002 |
| JP | 2129948 | 5/1990 | WO | 9956316 | 11/1999 |
| JP | 369248 | 7/1991 | WO | 9967821 | 12/1999 |
| JP | 3177060 | 8/1991 | | | |
| JP | 3289162 | 12/1991 | | | |
| JP | 4098864 | 3/1992 | | | |
| JP | 4-230063 | * 8/1992 | | | |
| JP | 5129473 | 5/1993 | | | |
| JP | 5166992 | 7/1993 | | | |
| JP | 5283460 | 10/1993 | | | |
| JP | 6061401 | 3/1994 | | | |
| JP | 692076 | 4/1994 | | | |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

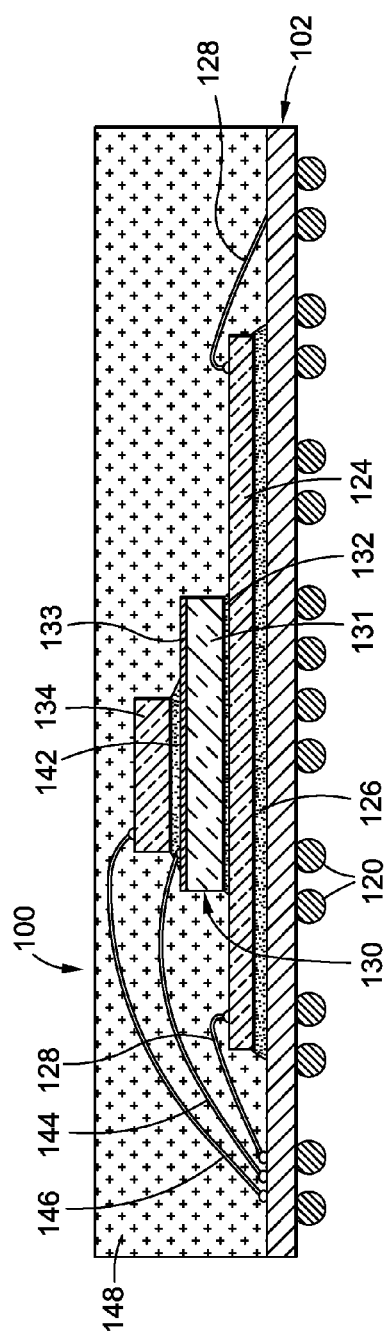
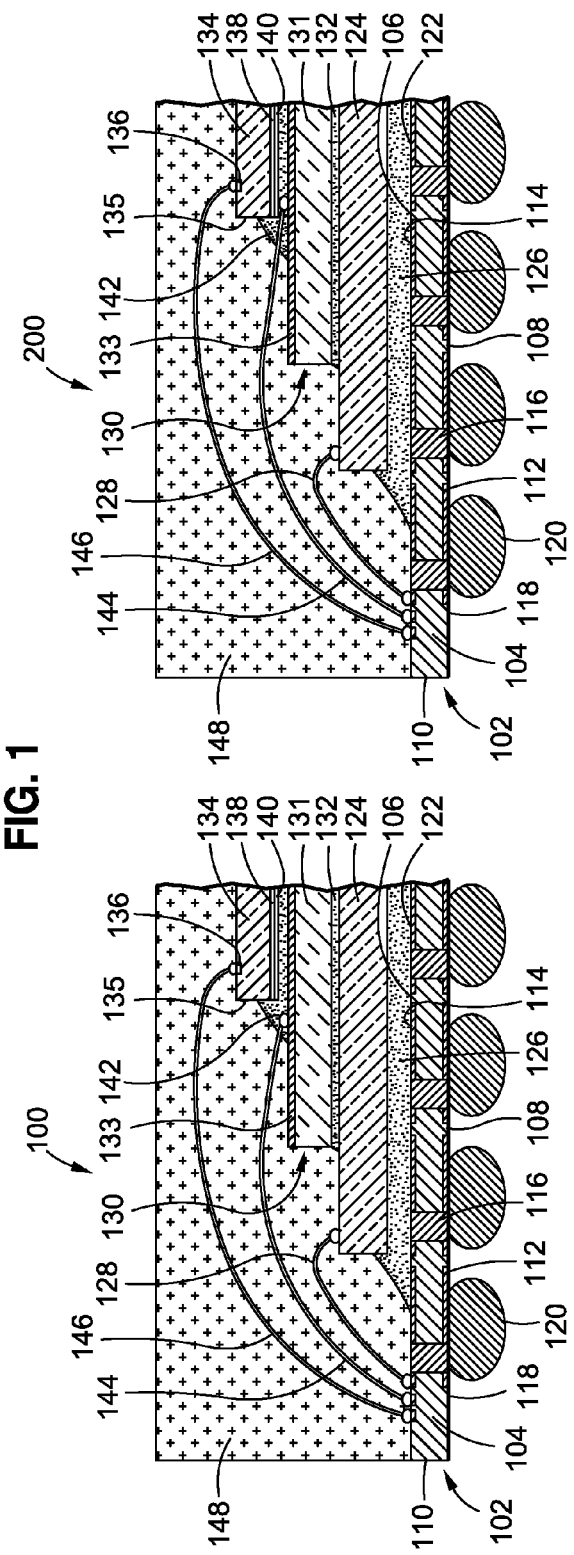

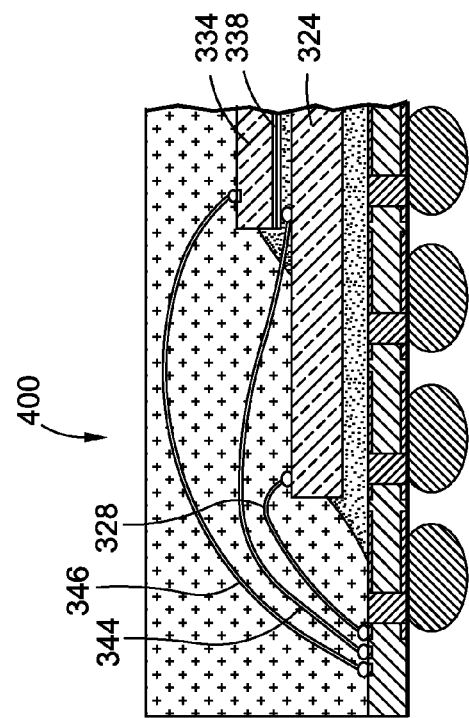
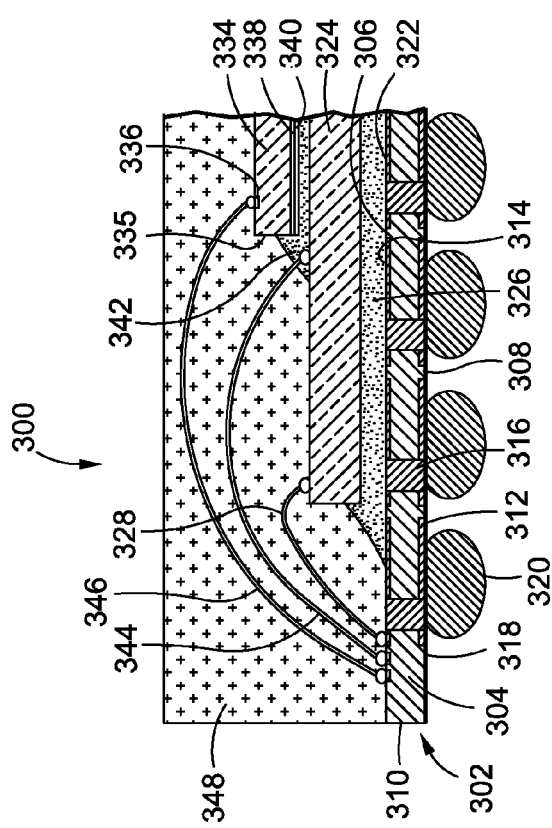

SEMICONDUCTOR PACKAGE WITH FAST POWER-UP CYCLE AND METHOD OF MAKING SAME

CROSS-REFERENCE TO RELATED APPLICATIONS

The present application is a continuation of U.S. patent application Ser. No. 12/105,196 now U.S. Pat. No. 7,768,135 entitled SEMICONDUCTOR PACKAGE WITH FAST POWER-UP AND METHOD OF MAKING SAME filed Apr. 17, 2008.

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package including stacked electronic components which are separated from each other by a spacer, both of the electronic components being electrically connected to an underlying substrate through the use of conductive wires, with the electrical connection of at least one of the conductive wires to the uppermost electronic component of the stack being facilitated by the use of a conductive paste and/or through the use of the spacer.

2. Description of the Related Art

There is currently known in the prior art a specific type of semiconductor package which comprises a substrate having a first electronic component such as an integrated circuit attached to the top surface thereof. Attached to the top surface of the integrated circuit is a spacer which is fabricated from Si coated with aluminum. Attached to the top surface of the spacer is a second electronic component.

In the prior art semiconductor package, conductive wires are used to electrically connect pads or terminals of the first electronic component to the substrate. Similarly, a conductive wire is used to electrically connect a pin disposed on the top surface of the second electronic component and serving as the emitter thereof to the substrate. In the prior art semiconductor package, the second electronic component also includes a collector disposed on the bottom surface thereof, opposite the top surface which includes the pin disposed thereon. Such collector typically has a layer of gold plating applied thereto. The proper operation of the second electronic component within the semiconductor package necessitates that the collector be placed into electrical connection with the substrate. In the prior art semiconductor package, such electrical connection is facilitated by attaching the bottom surface of the second electronic component, which defines the collector, to the aluminum-coated spacer through the use of a layer of a conductive paste. With the collector of the second electronic component being electrically connected thereto via the conductive paste layer, the spacer is in turn electrically connected to the substrate through the use of a conductive wire. In the prior art semiconductor package, a portion of the substrate, the first electronic component or integrated circuit, the spacer, the second electronic component, and the wires are each covered by a package body.

The prior art semiconductor package described above suffers from a substantial deficiency. More particularly, with regard to the aluminum-coated Si spacer integrated into the semiconductor package, such spacer normally has a native layer of aluminum oxide disposed on the top surface to which one end of the wire extending to the substrate is electrically connected and to which the collector of the second electronic component is electrically connected by the conductive paste layer. The native aluminum oxide layer is typically in the thickness range of from about ten to fifty angstroms. It is been determined that the aluminum oxide layer of the spacer acts as a dielectric layer of a capacitor, and that during the first time power-up of the prior art semiconductor package, causes a substantial time delay in such power-up.

Due to any first time power-up delay in the prior art semiconductor package being highly undesirable, attempts have been made in the prior art to eliminate such delay. Such solutions have included plasma cleaning the aluminum-coated spacer in an attempt to remove the native oxide layer and/or increasing the percentage of the area of the bottom surface of the second electronic component defining the collector thereof which is electrically connected to the spacer through the use of the conductive paste layer. However, none of the attempted solutions highlighted have proven to be effective in achieving acceptable start-up time parameters in the first power-up cycle of the prior art semiconductor package that are consistent to those which are typically measured in second and subsequent power-up cycles thereof. In this regard, despite increasing the percentage of that area of the second electronic component defining the collector electrically connected to the spacer through the use of the conductive paste layer and/or plasma cleaning the spacer, the adverse effect of the aluminum oxide layer of the spacer as a capacitor is still prevalent in the prior art semiconductor package.

The present invention provides a novel, unique solution to the power-up delay problem highlighted above. The solution provided by the present invention is discussed in detail below.

BRIEF SUMMARY OF THE INVENTION

In accordance with the present invention, there is provided multiple embodiments of a semiconductor package including at least two electronic components which are provided in a stacked arrangement, and are each electrically connected to an underlying substrate through the use of conductive wires. In accordance with one embodiment of the present invention, the electronic components are separated from each other by an intervening spacer which is typically fabricated from silicon coated with aluminum. In this particular embodiment, the uppermost electronic component of the stack is electrically connected to at least one of the conductive wires through the use of a conductive paste layer which is also used to secure the uppermost electronic component to the underlying spacer. In this regard, one end of one of the conductive wires may be embedded in the conductive paste layer adjacent to one side of the uppermost electronic component, or between the bottom surface of such electronic component and the spacer.

In accordance with an alternative embodiment of the present invention, the spacer may be eliminated in its entirety, with the conductive paste layer being used to attach the uppermost electronic component directly to the lowermost electronic component in the semiconductor package. In this regard, similar to the aforementioned embodiment, one end of one of the conductive wires may be embedded in the conductive paste layer adjacent to one side of the uppermost electronic component, or between the bottom surface of such electronic component and the lowermost electronic component.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a cross-sectional view of a semiconductor package constructed in accordance with a first embodiment of the present invention;

FIG. 2 is a partial cross-sectional view of the semiconductor package shown in FIG. 1;

FIG. 3 is a partial cross-sectional view of a semiconductor package constructed in accordance with a second embodiment of the present invention;

FIG. 4 is a partial cross-sectional view of a semiconductor package constructed in accordance with a third embodiment of the present invention; and FIG. 5 is a partial cross-sectional view of a semiconductor package constructed in accordance with a fourth embodiment of the present invention.

Common reference numerals are used throughout the drawings and detailed description to indicate like elements.

DETAILED DESCRIPTION OF THE INVENTION

Referring now to the drawings wherein the showings are for purposes of illustrating various embodiments of the present invention only, and not for purposes of limiting the same, FIGS. 1 and 2 illustrate a semiconductor package 100 constructed in accordance with a first embodiment of the present invention. The semiconductor package 100 comprises a substrate 102 which functions to transmit electrical signals to and from the semiconductor package 100. The substrate 102 comprises an insulative layer 104 which defines a generally planar first (top) surface 106 and an opposed, generally planar second (bottom) surface 108. The insulative layer 104 further comprises a third (side) surface 110 which extends generally perpendicularly between the top and bottom surfaces 106 and 108. The insulative layer 104 may comprise a base film formed from a thermosetting resin, a polyimide, or an equivalent material.

The substrate 102 further comprises one or more electrically conductive lands 112 which are formed on the bottom surface 108 in a prescribed pattern or arrangement. Each of the lands 112 preferably has a generally circular configuration, though different shapes for the lands 112 are contemplated to be within the spirit and scope of the present invention. The substrate 102 also includes an electrically conductive pattern 114 which is formed on the top surface 106. The conductive pattern 114 may comprise various pads, lands, traces, or combinations thereof. In the substrate 102, the lands 112 and the conductive pattern 114 are electrically connected to each other in a prescribed pattern or arrangement through the use of conductive vias 116 which extend through the insulative layer 104 between the top and bottom surfaces 106, 108 thereof in the manner shown in FIG. 2. In the semiconductor package 100, it is contemplated that the lands 112, conductive pattern 114 and vias 116 will each be formed from copper or a suitable equivalent material having acceptable electrical conductivity. With particular regard to the vias 116, it is further contemplated that such vias 116 may be formed by coating the walls of cylindrical apertures extending through the insulative layer 104 with a conductive metal film which places the lands 112 into electrical connection with the conductive pattern 114 in a prescribed manner.

The substrate 102 further preferably includes a solder mask 118 which is formed on the bottom surface 108 of the insulative layer 104. As seen in FIG. 2, the solder mask 118 is formed to surround and cover a predetermined region of the periphery of each of the lands 112. As also seen in FIGS. 1 and 2, it is contemplated that in the substrate 102, solder balls 120 will be electrically coupled to respective ones of the lands 112, such solder balls 120 being used to transmit electrical signals between the semiconductor package 100 and an external device. The solder mask 118, which contacts each of the solder balls 120, electrically insulates each of the solder balls 120 from the adjacent lands 112 on which other solder balls 120 are formed. In the substrate 102, portions of the conductive pattern 114 of the substrate 102 may also be covered by a solder mask 122 which is included on the top surface 106 of the substrate 102 as shown in FIG. 2.

The semiconductor package 100 further comprises a first (lower) electronic component 124 which is attached to the substrate 102, and in particular to the solder mask 122 which is applied to portions of the top surface 106 of the insulative layer 104 and the conductive pattern 114. The attachment of the first electronic component 124 to the substrate 102 is preferably accomplished by a layer 126 of a suitable paste or film adhesive.

As best seen in FIG. 2, the first electronic component 124 further includes one or more bond pads or terminals disposed on the top surface thereof which is opposite the bottom surface contacting the adhesive layer 126. Each of the bond pads of the first electronic component 124 is electrically coupled or connected to a prescribed portion of the conductive pattern 114 through the use of an elongate, first conductive wire 128. One end of each first conductive wire 128 may be ball-bonded to a respective one of the bond pads of the first electronic component 124, with the opposed end of such first conductive wire 128 being electrically connected to the conductive pattern 114 through the use of, for example, a stitch-bonding technique. In this regard, each first conductive wire 128 may include a generally spherical ball bonding portion which is formed on a respective one of the bond pads of the first electronic component 124, and a stitch bonding portion which is formed on a prescribed portion of the conductive pattern 114. As will be recognized by those of ordinary skill in the art, the first conductive wires 128 electrically couple the first electronic component 124 to the conductive pattern 114, and hence the substrate 102. Each of the first conductive wires 128 is preferably formed through the use of a capillary and, as shown in FIG. 2, is formed in a forward loop mode. Though not shown, it is contemplated that each first conductive wire 128 may alternatively be formed in a reverse loop mode. More particularly, in the reverse loop mode, one end of each first conductive wire 128 may form a ball-bonding portion on a prescribed portion of the conductive pattern 114, with the other end of such first conductive wire 128 forming a stitch-bonding portion on a respective one of the bond pads of the first electronic component 124, such reverse loop mode of first conductive wires 128 also being formed through the use of a capillary. Each of the first conductive wires 128 is preferably fabricated from a material having adequate electrical conductivity, such as aluminum, copper, gold, or equivalent materials thereto. Though not shown, it is also contemplated that the first electronic component 124 may be electrically connected to the conductive pattern 114 through the use of flipchip bonding as an alternative to the use of the first conductive wires 128.

The semiconductor package 100 further comprises a spacer 130 which is attached to the top surface of the first electronic component 124, i.e., the surface opposite that affixed to the adhesive layer 126. The attachment of the bottom surface of the spacer 130 to the top surface of the first electronic component 124 is preferably accomplished through the use of a layer 132 of a suitable paste or film adhesive. The spacer 130 is typically fabricated from a silicon core 131 which coated or plated with an aluminum layer 133. As shown in FIGS. 1-3, the aluminum layer 133 is applied to only the top surface of the core 131, i.e., the surface opposite that attached to the adhesive layer 132. Though not shown, it is contemplated that spacer 130 may alternatively be configured such that a second aluminum layer like the aluminum layer 133 is applied to the bottom surface of the core 131, and thus disposed in contact with the adhesive layer 132. The spacer 130 may also be formed in a manner in which all sides or surfaces of the core 131 are covered with an aluminum layer. Still further, the spacer 130 may be formed entirely from aluminum. In any embodiment of the spacer 130, the aluminum plated thereon or from which it is fabricated typically has a native layer of aluminum oxide disposed thereon in a thickness in the range of from about ten to fifty angstroms. Additionally, as seen in FIG. 1, the spacer 130 is typically of a size which is smaller than that of the first electronic component 124, thus resulting in the peripheral side surface of the spacer 130 being disposed inward relative to the bond pads or terminals of the first electronic component 124. However, the spacer 130 may be larger than the first electronic component 124.

The semiconductor package 100 further comprises a second (upper) electronic component 134 which is attached to the generally planar top surface of the spacer 130. In the semiconductor package 100, the second electronic component 134 includes a pin 136 disposed on the top surface thereof, and a terminal 138 disposed on the bottom surface thereof, such terminal 138 typically having a layer 140 of gold plating applied thereto. In the semiconductor package 100, the attachment of the second electronic component 134 to the spacer 130 is facilitated by a layer 142 of conductive paste. As best seen in FIG. 2, the conductive paste layer 142 is interposed between the gold plating layer 140 and the top surface of the spacer 130. Additionally, the conductive paste layer 142 is formed so as to flow outward beyond the peripheral side surface 135 of the second electronic component 134. Along these lines, a portion of the conductive paste layer 142 also flows or migrates upwardly along a portion of the peripheral side surface 135 of the second electronic component 134.

In the semiconductor package 100, the proper operation of the second electronic component 134 necessitates that the terminal 138 thereof be placed into electrical connection with the conductive pattern 114 of the substrate 102. Such electrical connection is facilitated by the use of a second conductive wire 144. The second conductive wire 144 is preferably formed through the use of a capillary and, as shown in FIG. 2, may be formed in a reverse loop mode to minimize the loop height thereof. In this regard, one end of the second conductive wire 144 may be stitch-bonded to a prescribed location on the top surface of the spacer 130, with the opposed end of such second conductive wire 144 being electrically connected to the conductive pattern 114 through the use of, for example, a ball-bonding technique. More particularly, the second conductive wire 144 may include a stitch-bonding portion which is formed at a prescribed location on the top surface of the spacer 130, and generally spherical ball-bonding portion which is formed on a prescribed portion of the conductive pattern 114. The second conductive wire 144 electrically couples the terminal 138 of the second electronic component 134 to the conductive pattern 114, and hence the substrate 102, as will be described in more detail below. Though not shown, it is contemplated that the second conductive wire 144 may alternatively be formed in a forward loop mode. More particularly, in the forward loop mode, one end of the second conductive wire 144 may form a stitch-bonding portion on a prescribed portion of the conductive pattern 114, with the other end of such second conductive wire 144 forming a ball-bonding portion at a prescribed location on the top surface of the spacer 130, such forward loop mode second conductive wire 144 also being formed through the use of a capillary. The second conductive wire 144 may be fabricated from the same material as the first conductive wires 128 described above.

In addition to one end of the second conductive wire 144 being stitch-bonded or ball-bonded to a prescribed location on the top surface of the spacer 130, such end of the second conductive wire 144 is also covered or encapsulated by the conductive paste layer 142 used to attach the second electronic component 134 to the spacer 130. As a result of one end of the second conductive wire 144 being embedded within the conductive paste layer 142, electrical signals or current may be routed directly from the terminal 138 to the second conductive wire 144 via the conductive paste layer 142, thus bypassing the spacer 130. Thus, the transmission of electrical signals or current between the second electronic component 134 and the second conductive wire 144 is unaffected by any capacitance effect that could otherwise be imparted by the spacer 130. As is best seen in FIG. 2, the conductive paste layer 144 preferably covers or encapsulates the stitch-bonding or ball-bonding portion of the second conductive wire 144 disposed on the top surface of the spacer 130, and a small portion of the second conductive wire 144 extending from such stitch-bonding or ball-bonding portion. Additionally, as is further seen in FIG. 2, the covered or encapsulated portion of the second conductive wire 144 is preferably disposed slightly outward relative to the peripheral side surface 135 of the second electronic component 134. Since, in the semiconductor package 100, the conductive paste layer 142 is the vehicle which establishes the electrical connection between the second electronic component 134 and the second conductive wire 144, the spacer 130 is needed only to establish wire bond integrity attributable to the stitch-bonding or ball-bonding of one end of the second conductive wire 144 thereto.

As further seen in FIG. 2, the pin 136 of the second electronic component 134 is electrically connected to a prescribed portion of the conductive pattern 114 through the use of an elongate, third conductive wire 146. The third conductive wire 146 is also preferably formed through the use of a capillary and, as shown in FIG. 2, may also be formed in a reverse loop mode to minimize the loop height thereof. In this regard, one end of the third conductive wire 146 may be stitch-bonded to the pin 136, with the opposed end of such third conductive wire 146 being electrically connected to the conductive pattern 114 through the use of, for example, a ball-bonding technique. More particularly, the third conductive wire 146 may include a stitch-bonding portion which is formed on the pin 136, and a generally spherical ball-bonding portion which is formed on a prescribed portion of the conductive pattern 114. Though not shown, it is contemplated that the third conductive wire 146 may alternatively be formed in a forward loop mode. More particularly, in the forward loop mode, one end of the third conductive wire 146 may form a stitch-bonding portion on a prescribed portion of the conductive pattern 114, with the other end of such third conductive wire 146 forming a ball-bonding portion on the pin 136. Such forward loop mode third conductive wire 146 will also be fabricated from the same material as the first conductive wires 128 described above.

The semiconductor package 100 further comprises a package body 148 which is formed on the substrate 102 so as to effectively cover or encapsulate the first and second electronic components 124, 134 and the intervening spacer 130. The package body 148 also covers the exposed portions of the conductive pattern 114, the solder mask 122, and any exposed portion of the top surface 106 of the insulative layer 104. The package body 148 is further preferably formed such that the side surface thereof, which extends generally perpendicularly from the generally planar top surface thereof, is substantially flush or continuous with the peripheral side surface 110 of the insulative layer 104, as well as the peripheral edge of the solder mask 118 applied to the bottom surface 108 of the insulative layer 104. As will be recognized by those of ordinary skill in the art, the package body 148 effectively protects the internal elements of the semiconductor package 100 described above from the external environment. The package body 148 may be fabricated from a conventional epoxy resin, silicon resin, or an equivalent material thereto.

The configuration of the semiconductor package 100 as shown in FIGS. 1 and 2 achieves substantial consistency in the start-up delay parameters for the first power-up cycle of the semiconductor package 100 in comparison to the delay times measured in second and subsequent power-up cycles thereof. The consistency in these delays, which is well within acceptable delay parameters, is attributable to the effective bypass of the spacer 130 in transmitting electrical signals or current between the second electronic component 134 and the second conductive wire 144. In the semiconductor package 100, the first and second electronic components 124, 134 may each comprise an integrated circuit, a semiconductor die, a transistor, etc. By way of example only, the second electronic component 134 of the semiconductor package 100 may comprise a transistor wherein the pin 136 is an emitter which is electrically connected to the conductive pattern 114 by the third conductive wire 146, and the terminal 138 is a collector which is electrically connected to the second conductive wire 144 by the conductive paste layer 142. Additionally, the first electronic component 124 of the semiconductor package 100 may comprise a power management integrated circuit die (PMIC).

Referring now to FIG. 3, there is shown a semiconductor package 200 constructed in accordance with a second embodiment of the present invention. The semiconductor package 200 is substantially similar in structure and function to the above-described semiconductor package 100. Accordingly, only the distinctions between the semiconductor packages 200, 100 will be described below.

As explained above in relation to the semiconductor package 100, though one end of the second conductive wire 144 thereof may be stitch-bonded or ball-bonded to a prescribed location on the top surface of the spacer 130, the second conductive wire 144 is shown in FIG. 2 in a reverse loop mode wherein the end thereof attached to the spacer 130 is stitch-bonded to a prescribed location on the top surface of the spacer 130. Forming the second conductive wire 144 in the semiconductor package 100 in the reverse loop mode effectively lowers the profile or loop height thereof, in comparison to the first conductive wire 128 of the semiconductor package 100 which is shown in FIG. 2 as being formed in a forward loop mode, thus increasing the profile or loop height thereof.

As in the semiconductor package 100 of FIG. 2, the first, second and third conductive wires 128, 144, 146 may each be formed in either a forward loop or a reverse loop mode in the semiconductor package 200. The sole distinction between the semiconductor packages 100, 200 lies in the location of the bonded portion of the second conductive wire 144 of the semiconductor package 200 upon the top surface of the spacer 130 thereof, in comparison to the location of the bonded portion of the second conductive wire 144 of the semiconductor package 100 relative to the top surface of the spacer 130 thereof. More particularly, in the semiconductor package 200 as shown in FIG. 3, the bonded portion of the second conductive wire 144 used to facilitate the attachment thereof to the spacer 130 is disposed between the terminal 138 of the second electronic component 134 and the top surface of the spacer 130. This is in contrast to the semiconductor package 100 wherein, as described above, the bonded portion used to attach the second conductive wire 144 to the spacer 130 is disposed outward relative to the peripheral side surface 135 of the second electronic component 134. Since, in the semiconductor package 200, a portion of the second conductive wire 144, including the bonded portion thereof facilitating the attachment to the spacer 130, is sandwiched between the second electronic component 134 and the spacer 130, the second conductive wire 144 must necessarily be formed to have the low profile as described above. Additionally, the first and third conductive wires 128, 146 of the semiconductor package 200, like those described in relation to the semiconductor package 100, may each be formed in either a forward loop mode or a reverse loop mode.

Referring now to FIG. 4, there is shown a semiconductor package 300 constructed in accordance with a third embodiment of the present invention. The semiconductor package 300 comprises a substrate 302 which functions to transmit electrical signals to and from the semiconductor package 100. The substrate 302 comprises an insulative layer 304 which defines a generally planar first (top) surface 306 and an opposed, generally planar second (bottom) surface 308. The insulative layer 304 further comprises a third (side) surface 310 which extends generally perpendicularly between the top and bottom surfaces 306 and 308. The insulative layer 304 may comprise a base film formed from a thermosetting resin, a polyimide, or an equivalent material.

The substrate 302 further comprises one or more electrically conductive lands 312 which are formed on the bottom surface 308 in a prescribed pattern or arrangement. Each of the lands 312 preferably has a generally circular configuration, though different shapes for the lands 312 are contemplated to be within the spirit and scope of the present invention. The substrate 302 also includes an electrically conductive pattern 314 which is formed on the top surface 306. The conductive pattern 314 may comprise various pads, traces, or combinations thereof. In the substrate 302, the lands 312 and the conductive pattern 314 are electrically connected to each other in a prescribed pattern or arrangement through the use of conductive vias 316 which extend through the insulative layer 304 between the top and bottom surfaces 306, 308 thereof in the manner shown in FIG. 4. In the semiconductor package 300, it is contemplated that the lands 312, conductive pattern 314 and vias 316 will each be formed from copper or a suitable equivalent material having acceptable electrical conductivity. With particular regard to the vias 316, it is further contemplated that such vias 316 may be formed by coating the walls of cylindrical apertures extending through the insulative layer 304 with a conductive metal film which places the lands 312 into electrical communication with the conductive pattern 314 in a prescribed manner.

The substrate 302 further preferably includes a solder mask 318 which is formed on the bottom surface 308 of the insulative layer 304. As seen in FIG. 4, the solder mask 318 is formed to surround and cover a predetermined region of the periphery of each of the lands 312. As also seen in FIG. 4, it is contemplated that in the substrate 302, solder balls 320 will be electrically coupled to respective ones of the lands 312, such solder balls 320 being used to transmit electrical signals between the semiconductor package 300 and an external device. The solder mask 318, which contacts each of the solder balls 320, electrically insulates each of the solder balls 320 from the adjacent lands 312 on which other solder balls 320 are formed. In the substrate 302, portions of the conductive pattern 314 of the substrate 302 may also be covered by a solder mask 322 as shown in FIG. 4.

The semiconductor package 300 further comprises a first (lower) electronic component 324 which is attached to the substrate 302, and in particular to the solder mask 322 which is applied to portions of the top surface 306 of the insulative layer 304 and the conductive pattern 314. The attachment of the first electronic component 324 to the substrate 302 is preferably accomplished by a layer 326 of a suitable paste or film adhesive.

As seen in FIG. 4, the first electronic component 324 further includes one or more bond pads or terminals disposed on the top surface thereof which is opposite the bottom surface contacting the adhesive layer 326. Each of the bond pads of the first electronic component 324 is electrically coupled or connected to a prescribed portion of the conductive pattern 314 through the use of an elongate, first conductive wire 328. One end of each first conductive wire 328 may be ball-bonded to a respective one of the bond pads of the first electronic component 324, with the opposed end of such first conductive wire 328 being electrically connected to the conductive pattern 314 through the use of, for example, a stitch-bonding technique. In this regard, each first conductive wire 328 may include a generally spherical ball bonding portion which is formed on a respective one of the bond pads of the first electronic component 324, and a stitch bonding portion which is formed on a prescribed portion of the conductive pattern 314. As will be recognized by those of ordinary skill in the art, the first conductive wires 328 electrically couple the first electronic component 324 to the conductive pattern 314, and hence the substrate 302. Each of the first conductive wires 328 is preferably formed through the use of a capillary and, as shown in FIG. 4, is formed in a forward loop mode. Though not shown, it is contemplated that each first conductive wire 328 may alternatively be formed in a reverse loop mode. More particularly, in the reverse loop mode, one end of each first conductive wire 328 may form a ball-bonding portion on a prescribed portion of the conductive pattern 314, with the other end of such first conductive wire 328 forming a stitch-bonding portion on a respective one of the bond pads of the first electronic component 324, such reverse loop mode of first conductive wires 328 also being formed through the use of a capillary. Each of the first conductive wires 328 is preferably fabricated from a material having acceptable electrical conductivity, such as aluminum, copper, gold, or equivalent materials thereto. Though not shown, it is also contemplated that the first electronic component 324 may be electrically connected to the conductive pattern 314 through the use of flipchip bonding as an alternative to the use of the first conductive wires 328.

The semiconductor package 300 further comprises a second (upper) electronic component 334 which is attached to the generally planar top surface of the first electronic component 324. As seen in FIG. 4, the second electronic component 334 is typically of a size which is smaller than that of the first electronic component 124, thus resulting in the peripheral side surface 335 of the second electronic component 334 being disposed inward relative to the bond pads or terminals of the first electronic component 324. In the semiconductor package 300, the second electronic component 334 typically includes a pin 336 disposed on the top surface thereof, and a terminal 338 disposed on the bottom surface thereof, such terminal 338 typically having a layer 340 of gold plating applied thereto. Additionally, in the semiconductor package 300, the attachment of the second electronic component 334 to the first electronic component 324 is facilitated by a layer 342 of conductive paste. As seen in FIG. 4, the conductive paste layer 342 is interposed between the gold plating layer 340 and the top surface of the first electronic component 324. Additionally, the conductive paste layer 342 is formed so as to flow outward beyond the peripheral side surface 335 of the second electronic component 334. Along these lines, a portion of the conductive paste layer 342 also flows or migrates upwardly along a portion of the peripheral side surface 335 of the second electronic component 334.

In the semiconductor package 300, the proper operation of the second electronic component 334 necessitates that the terminal 338 thereof be placed into electrical connection with the conductive pattern 314 of the substrate 302. Such electrical connection is facilitated by the use of a second conductive wire 344. The second conductive wire 344 is preferably formed through the use of a capillary and, as shown in FIG. 4, may be formed in a reverse loop mode to minimize the loop height thereof. In this regard, one end of the second conductive wire 344 may stitch-bonded to a prescribed location on the top surface of the first electronic component 324, with the opposed end of such second conductive wire 144 being electrically connected to the conductive pattern 314 through the use of, for example, a ball-bonding technique. More particularly, the second conductive wire 344 may include a stitch-bonding portion which is formed at a prescribed location on the top surface of the first electronic component 324, and generally spherical ball-bonding portion which is formed on a prescribed portion of the conductive pattern 314. In order for the stitch-bonding portion of the second conductive wire 344 to be properly secured to the underlying first electronic component 324, it is contemplated that the first electronic component 324 will be provided with a suitable opening in its passivation layer as needed to accommodate the corresponding end of the second conductive wire 344. The second conductive wire 344 electrically couples the terminal 338 of the second electronic component 334 to the conductive pattern 314, and hence the substrate 302, as will be described in more detail below. Though not shown, it is contemplated that the second conductive wire 344 may alternatively be formed in a forward loop mode. More particularly, in the forward loop mode, one end of the second conductive wire 344 may form a stitch-bonding portion on a prescribed portion of the conductive pattern 314, with the other end of such second conductive wire 344 forming a ball-bonding portion at the complimentary opening in the passivation layer of the first electronic component 324, such forward loop mode second conductive wire 344 also being formed through the use of a capillary. The second conductive wire 344 may be fabricated from the same material as the first conductive wires 328 described above.

In addition to one end of the second conductive wire 344 being stitch-bonded or ball-bonded to a prescribed location on the top surface of the first electronic component 324, such end of the second conductive wire 344 is also covered or encapsulated by the conductive paste layer 342 used to attach the second electronic component 334 to the first electronic component 324. As a result of one end of the second conductive wire 344 being embedded within the conductive paste layer 342, electrical signals or current may be routed directly from the terminal 338 to the second conductive wire 344 via the conductive paste layer 342. Thus, the transmission of electrical signals or current between the second electronic component 334 and the second conductive wire 344 is unaffected by any capacitance effect that could otherwise be imparted by the above-described spacer 130 due to the complete absence of such spacer in the semiconductor package 300. As seen in FIG. 4, the conductive paste layer 344 preferably covers or encapsulates the stitch-bonding or ball-bonding portion of the second conductive wire 344 disposed on the top surface of the first electronic component 324, and a small portion of the second conductive wire 344 extending from such stitch-bonding or ball-bonding portion. Additionally, the covered or encapsulated portion of the second conductive wire 344 is preferably disposed slightly outward relative to the peripheral side surface 335 of the second electronic component 334. Since, in the semiconductor package 300, the conductive paste layer 342 is the vehicle which establishes the electrical communication between the second electronic component 334 and the second conductive wire 344, the attachment of the second conductive wire 344 to the first electronic component 324 is needed only to establish wire bond integrity.

As further seen in FIG. 4, the pin 336 of the second electronic component 334 is electrically connected to a prescribed portion of the conductive pattern 314 through the use of an elongate, third conductive wire 346. The third conductive wire 346 is also preferably formed through the use of a capillary and, as shown in FIG. 4, may also be formed in a reverse loop mode to minimize the loop height thereof. In this regard, one end of the third conductive wire 346 may be stitch-bonded to the pin 336, with the opposed end of such third conductive wire 346 being electrically connected to the conductive pattern 314 through the use of, for example, a ball-bonding technique. More particularly, the third conductive wire 346 may include a stitch-bonding portion which is formed on the pin 336, and a generally spherical ball-bonding portion which is formed on a prescribed portion of the conductive pattern 314. Though not shown, it is contemplated that the third conductive wire 346 may alternatively be formed in a forward loop mode. More particularly, in the forward loop mode, one end of the third conductive wire 346 may form a stitch-bonding portion on a prescribed portion of the conductive pattern 314, with the other end of such third conductive wire 346 forming a ball-bonding portion on the pin 336. Such forward loop mode third conductive wire 346 will also be fabricated from the same material as the first conductive wires 328 described above.

The semiconductor package 300 further comprises a package body 348 which is formed on the substrate 302 so as to effectively cover or encapsulate the first and second electronic components 324, 334. The package body 348 also covers the exposed portions of the conductive pattern 314, the solder mask 322, and any exposed portion of the top surface 306 of the insulative layer 304. The package body 348 is further preferably formed such that the side surface thereof, which extends generally perpendicularly from the generally planar top surface thereof, is substantially flush or continuous with the peripheral side surface 310 of the insulative layer 304, as well as the peripheral edge of the solder mask 318 applied to the bottom surface 308 of the insulative layer 304. As will be recognized by those of ordinary skill in the art, the package body 348 effectively protects the internal elements of the semiconductor package 300 described above from the external environment. The package body 348 may be fabricated from a conventional epoxy resin, silicon resin, or an equivalent material thereto. By way of example only, the second electronic component 334 of the semiconductor package 300 may comprise a transistor wherein the pin 336 is an emitter which is electrically connected to the conductive pattern 314 by the third conductive wire 346, and the terminal 338 is a collector which is electrically connected to the second conductive wire 344 by the conductive paste layer 342. Additionally, the first electronic component 324 of the semiconductor package 300 may comprise a power management integrated circuit die (PMIC).

Referring now to FIG. 5, there is shown a semiconductor package 400 constructed in accordance with a fourth embodiment of the present invention. The semiconductor package 400 is substantially similar in structure and function to the above-described semiconductor package 300. Accordingly, only the distinctions between the semiconductor packages 400, 300 will be described below.

As explained above in relation to the semiconductor package 300, though one end of the second conductive wire 344 thereof may be stitch-bonded or ball-bonded to a prescribed location on the top surface of the first electronic component 324, the second conductive wire 344 is shown in FIG. 4 in a reverse loop mode wherein the end thereof attached to the first electronic component 324 is stitch-bonded to a prescribed location on the top surface of the first electronic component 324. Forming the second conductive wire 344 in the semiconductor package 300 in the reverse loop mode effectively lowers the profile or loop height thereof, in comparison to the first conductive wire 328 of the semiconductor package 300 which is shown in FIG. 4 as being formed in a forward loop mode, thus increasing the profile or loop height thereof.

As in the semiconductor package 300 of FIG. 4, the first, second and third conductive wires 328, 344, 346 may each be formed in either a forward loop or a reverse loop mode in the semiconductor package 400. The sole distinction between the semiconductor packages 300, 400 lies in the location of the bonded portion of the second conductive wire 344 of the semiconductor package 400 upon the top surface of the first electronic component 324 thereof, in comparison to the location of the bonded portion of the second conductive wire 344 of the semiconductor package 300 relative to the top surface of the first electronic component 324 thereof. More particularly, in the semiconductor package 400 as shown in FIG. 5, the bonded portion of the second conductive wire 344 used to facilitate the attachment thereof to the first electronic component 324 is disposed between the terminal 338 of the second electronic component 334 and the top surface of the first electronic component 324. This is in contrast to the semiconductor package 300 wherein, as described above, the bonded portion used to attach the second conductive wire 344 to the first electronic component 324 is disposed outward relative to the peripheral side surface 335 of the second electronic component 334. Since, in the semiconductor package 400, a portion of the second conductive wire 344, including the bonded portion thereof facilitating the attachment to the first electronic component 324, is sandwiched between the second electronic component 334 and the first electronic component 324, the second conductive wire 344 must necessarily be formed to have the low profile as described above. Additionally, the first and third conductive wires 328, 346 of the semiconductor package 400, like those described in relation to the semiconductor package 300, may each be formed in either a forward loop mode or a reverse loop mode.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
a substrate;
a first electronic component attached and electrically connected to the substrate;
a spacer attached to the first electronic component;
a second electronic component defining a peripheral side surface, the second electronic component being attached to the spacer by a conductive paste layer and electrically connected to the substrate by at least one conductive wire which is partially encapsulated by the conductive paste layer, the conductive wire having a first end which is attached to the spacer at a location disposed outward relative to the side surface of the second electronic component, and an opposed second end which is electrically connected to the substrate.

2. The semiconductor package of claim 1 wherein the first electronic component is electrically connected to the substrate by a conductive wire.

3. The semiconductor package of claim 1 wherein the second electronic component is also electrically connected to the substrate by another conductive wire.

4. The semiconductor package of claim 1 wherein the substrate comprises:
an insulative layer defining opposed first and second surfaces;
a plurality of lands disposed on the first surface; and
a conductive pattern disposed on the second surface and electrically connected to the lands in a prescribed manner, the first and second electronic components each being electrically connected to the conductive pattern.

5. The semiconductor package of claim 1 wherein the first end of the conductive wire which is partially encapsulated by the conductive paste layer is attached to the spacer via a stitch-bond.

6. A semiconductor package, comprising:
a substrate;
a first electronic component attached to the substrate;
a spacer attached to the first electronic component, the spacer comprising a core which is at least partially covered by an outer conductive layer;
a second electronic component defining a peripheral side surface, the second electronic component being attached to the outer conductive layer of the spacer by a conductive paste layer; and
a conductive wire which is partially encapsulated by the conductive paste layer, the conductive wire having a first end that is attached to the outer conductive layer of the spacer at a location which is disposed outward relative to the side surface of the second electronic component.

7. The semiconductor package of claim 6 wherein the substrate comprises:
an insulative layer defining opposed first and second surfaces;
a plurality of lands disposed on the first surface; and
a conductive pattern disposed on the second surface and electrically connected to the lands in a prescribed manner, the conductive wire being electrically connected to the conductive pattern.

8. The semiconductor package of claim 6 further comprising a package body which at least partially encapsulates the first and second electronic components, the spacer, the conductive wire, and the substrate.

9. The semiconductor package of claim 8 wherein the conductive wire which is partially encapsulated by the conductive paste layer is also partially covered by the package body.

10. The semiconductor package of claim 6 wherein the first end of the conductive wire is attached to the outer conductive layer of the spacer via a stitch-bond.

11. A semiconductor package, comprising:
a substrate;
a first electronic component attached and electrically connected to the substrate;
a spacer attached to the first electronic component;
a second electronic component attached to the spacer by a conductive paste layer and electrically connected to the conductive pattern of the substrate by at least one conductive wire which is partially encapsulated by the conductive paste layer, the conductive wire having a first end which is attached to a prescribed location on the spacer and an opposed second end which is electrically connected to the substrate, the second electronic component comprising a transistor having a collector which is electrically connected to the conductive wire by the conductive paste layer, and an emitter which is electrically connected to the substrate by another conductive wire.

12. A semiconductor package, comprising:
a substrate;
a first electronic component attached to the substrate;
a spacer attached to the first electronic component, the spacer comprising a core which is at least partially covered by an outer conductive layer;
a second electronic component attached to the outer conductive layer of the spacer by a conductive paste layer; and
a conductive wire which is partially encapsulated by the conductive paste layer;
the second electronic component comprising a transistor having an emitter which is electrically connected to the substrate and a collector which is electrically connected to the conductive wire by the conductive paste layer.

* * * * *